United States Patent
Potempa

(10) Patent No.: US 6,922,058 B2
(45) Date of Patent: Jul. 26, 2005

(54) METHOD FOR DETERMINING THE INTERNAL IMPEDANCE OF A BATTERY CELL IN A STRING OF SERIALLY CONNECTED BATTERY CELLS

(75) Inventor: Edward M. Potempa, Pittstown, NJ (US)

(73) Assignee: BTECH, Inc., Morris Plains, NJ (US)

( * ) Notice: Subject to any disclaimer, the term of this patent is extended or adjusted under 35 U.S.C. 154(b) by 13 days.

(21) Appl. No.: 10/741,490

(22) Filed: Dec. 19, 2003

(65) Prior Publication Data

US 2005/0134283 A1 Jun. 23, 2005

(51) Int. Cl.$^7$ .......................... H02J 7/00; G01N 27/27
(52) U.S. Cl. ........................... 324/430; 320/149
(58) Field of Search ......................... 324/426, 430, 324/432, 433, 434; 320/116–123, 126, 149

(56) References Cited

U.S. PATENT DOCUMENTS 5,485,090 A * 1/1996 Stephens .................... 324/433
6,404,166 B1 * 6/2002 Puchianu .................... 320/116
6,747,457 B2 * 6/2004 Suzuki ........................ 324/433

OTHER PUBLICATIONS

Ichimura et al. "Measuring the Internal Resistance of a Cell in Assembled Batteries", 1996 IEEE, pp. 784–791.*

* cited by examiner

*Primary Examiner*—Anjan Deb
*Assistant Examiner*—Jeff Natalini
(74) *Attorney, Agent, or Firm*—David L. Davis

(57) ABSTRACT

A method for determining the internal impedance of each battery cell within a system including at least one parallel string of serially connected battery cells without disconnecting the battery cells from the system, which initially makes measurements of two battery cells within each string to calculate the internal impedance of each of those two battery cells and to calculate a common impedance multiplier term for the rest of the battery cells in each string. The remaining battery cells in each string are individually measured and the common impedance multiplier term for that string is used to account for measured current which comes from the Thevenin equivalent voltage source of the rest of the system, in addition to current drawn from the battery cell being measured.

3 Claims, 1 Drawing Sheet

METHOD FOR DETERMINING THE INTERNAL IMPEDANCE OF A BATTERY CELL IN A STRING OF SERIALLY CONNECTED BATTERY CELLS

BACKGROUND OF THE INVENTION

This invention relates to a battery backup system having a plurality of battery cells arranged in parallel strings of serially connected battery cells and, more particularly, to a method for determining the internal impedance of each individual battery cell without disconnecting the battery cells from the system.

Large battery systems are commonly used to provide backup power in case there is a failure of the commercial power grid. Typically, such a backup system includes a single string, or a plurality of parallel strings, of serially connected rechargeable battery cells and a charger connected to the commercial power grid for maintaining the charge on the battery cells. An inverter is coupled between the strings of battery cells and the load, which inverter is enabled upon the detection of a failure of the commercial power grid. In some applications, the inverter may be continuously operational to power the load with energy from the charger during the time that commercial power is available. Many of these battery backup systems, called "uninterruptible power supplies" (UPS), are configured such that the load is never aware of any failure of the commercial power grid because the battery system immediately supplies the necessary energy upon detecting a failure of the commercial power grid.

A typical installation of such an uninterruptible power supply is between the commercial power grid and a large computer system used by financial, communications, manufacturing and other commercial industries. If the battery system is taken "off-line" for any reason, the necessary protection against a power outage is lost for the time that the battery system is not connected plus the time for recharging, if a significant amount of charge has been removed during the off-line period of time. However, such battery backup systems must be monitored on a regular basis to insure that protection from commercial power grid failure is always available. Therefore, systems have been developed to perform such monitoring while the battery backup system remains on-line.

Impedance measurement is a method by which the condition of a battery cell may be assessed without taking the battery system off-line. Impedance measurements typically impose a current (hereinafter called the "loading current") on the battery cell to be evaluated and measure the resulting voltage. Various commercially available test instruments function this way. Using Kelvin connections, these instruments impose a current on just the battery cell to be measured. After a measurement has been made, the operator moves the Kelvin clips to the next battery cell, reads the value, moves the clips again, and continues in this manner until all the battery cells have been measured. Therefore, the loading current flows almost entirely through the battery cell being measured, it being thought that the parallel paths (if they exist) are generally of so much higher impedance that any loading current flowing through them is of little or no consequence. However, the drawn current comes from not only the battery cell under test, but also from the Thevenin equivalent voltage source of the rest of the system. Therefore, to obtain consistently accurate results, an impedance multiplier term has to be calculated and used. In the past, one method used a current clamp or voltmeter with shunt to separately measure the string current. To avoid the expense of a current clamp, some battery cell impedance measurement systems simply ignore the impedance multiplier term. This results in a measurement that deviates from the true internal impedance just because the battery cell is in a string. The true impedance with this technique can then only be measured with the battery cell separated from the string. Another type of system lets the operator enter an impedance multiplier term, leading to guesswork by the operator.

It would therefore be desirable to be able to use an accurate impedance multiplier term in a battery cell impedance measurement system without requiring the expense of a current clamp.

SUMMARY OF THE INVENTION

The present invention is for use in a system having a plurality of rechargeable battery cells arranged in at least one string having a plurality of serially connected battery cells to form a battery system and including a charger coupled across the strings. This invention provides a method for determining the internal impedance of each of the plurality of serially connected battery cells in the at least one string while the battery cells remain connected in the battery system. The inventive method comprises the steps of:

a) drawing a first predetermined current $I_1$ across a first battery cell in a string;

b) measuring the voltage $V_{1,1}$ across the first battery cell during the drawing of the first predetermined current;

c) measuring the voltage $V_{2,1}$ across a second battery cell in the same string during the drawing of the first predetermined current;

d) drawing a second predetermined current $I_2$ across the second battery cell;

e) measuring the voltage $V_{1,2}$ across the first battery cell during the drawing of the second predetermined current;

f) measuring the voltage $V_{2,2}$ across the second battery cell during the drawing of the second predetermined current;

g) solving the two simultaneous equations $$I_1 = V_{1,1}/Z_1 + V_{2,1}/Z_2$$

$$I_2 = V_{1,2}/Z_1 + V_{2,2}/Z_2$$

for $Z_1$ and $Z_2$, where $Z_1$ is the internal impedance of the first battery cell and $Z_2$ is the internal impedance of the second cell;

h) calculating an impedance multiplier term IM from the equation $IM = (Z_2 I_1)/(I_1 Z_2 - V_{2,1})$; and i) for each of the remaining battery cells in the same string i1) drawing a predetermined current I across each battery cell;

i2) measuring the voltage V across each battery cell during the drawing of the predetermined current; and i3) calculating the internal impedance Z of each battery cell from the equation $Z = (V/I)IM$.

BRIEF DESCRIPTION OF THE DRAWINGS

The foregoing will be more readily apparent from reading the following description in conjunction with the drawings in which like elements in different figures thereof are identified by the same reference numeral and wherein.

DETAILED DESCRIPTION

Figure 1:
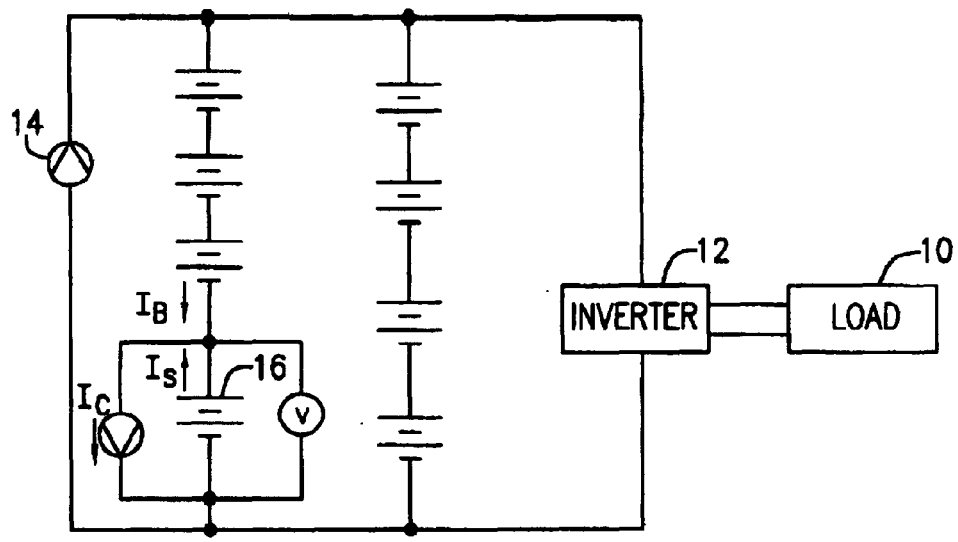
FIG. 1 is a simplified schematic circuit diagram illustrating a prior art arrangement for determining battery cell internal impedance in a UPS system with two strings and four battery cells per string.

FIG. 1 shows a typical prior art battery backup system coupled to a load 10 through an inverter 12. The battery-backup system includes at least one parallel string of serially connected rechargeable battery cells. To simplify the drawings and the following discussion, the battery backup system shown in FIG. 1 is illustrated as having two strings with four battery cells in each string, it being understood that an actual system would typically comprise many more strings each having many more (possibly one hundred or more) battery cells. A charger 14 is connected across the strings to maintain the battery cells at their full level of charge when the commercial power grid is operational. What is not shown in FIG. 1 is the commercial power grid, the direct connection of the charger 14 to the commercial power grid, the direct connection of the load 10 to the commercial power grid, or the arrangement which disconnects the load 10 from the commercial power grid upon detection of commercial power grid failure, since these are conventional and well known in the art.

The internal impedance $Z_B$ of the battery cell 16 in the string can be measured by controlling the dynamic current $I_c$ drawn from the battery cell 16 while measuring the dynamic voltage across the battery cell 16. The internal impedance of the cell 16 is given by the equation:

$$Z_B = (V_B/I_C) IM, \quad (1)$$

where IM is an impedance multiplier term. The impedance multiplier term IM is needed because the drawn current $I_C$ comes from the battery cell 16 under test and the Thevenin equivalent voltage source of the rest of the system. The internal impedance calculation needs to use battery cell current ($I_B$) in the denominator, so the impedance multiplier term for this case is:

$$IM = I_C/I_B = I_C/(I_C - I_S). \quad (2)$$

The measuring system controls $I_C$ and measures $V_B$. To measure $I_S$, a current clamp or voltmeter with shunt is used. The parameters are plugged into equations (2) and (1) to determine the internal impedance $Z_B$ of the battery cell 16.

Figure 2:
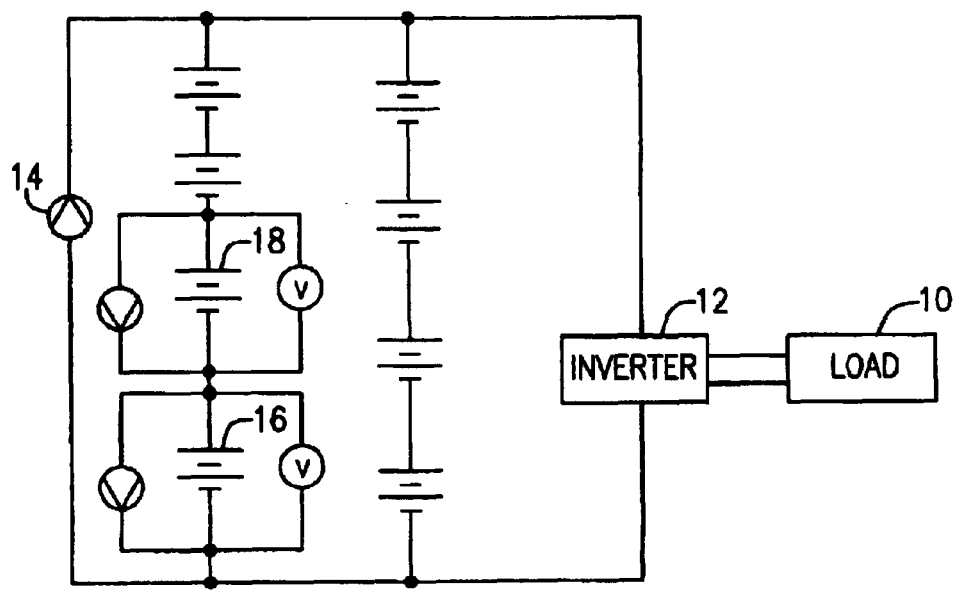
FIG. 2 is a simplified schematic circuit diagram similar to FIG. 1 illustrating an arrangement for practicing the inventive method for determining battery cell internal impedance.

FIG. 2 shows an arrangement for practicing an improved method for determining the internal impedance of a battery cell without incurring the expense of a current clamp and without sacrificing accuracy. First, controlled current $I_1$ is drawn from the first battery cell 16 and the rest of the system while the voltage $V_{1,1}$ is measured across the battery cell 16 and the voltage $V_{2,1}$ is measured across the second battery cell 18. Next, controlled current $I_2$ is drawn from the second battery cell 18 and the rest of the system while the voltage $V_{1,2}$ is measured across the battery cell 16 and the voltage $V_{2,2}$ is measured across the battery cell 18. The two internal impedances $Z_1$ and $Z_2$ of the battery cells 16 and 18, respectively, can be calculated by solving the two simultaneous equations:

$$I_1 = V_{1,1}/Z_1 + V_{2,1}/Z_2 \quad (3)$$

$$I_2 = V_{1,2}/Z_1 + V_{2,2}/Z_2. \quad (4)$$

It will be appreciated that this method does not use a current clamp or assumed impedance multiplier value to obtain the true internal impedance of the battery cells 16 and 18.

The internal impedance of each of the remaining battery cells in the string containing the battery cells 16 and 18 can be determined by controlling the dynamic current drawn from each battery cell while measuring the dynamic voltage across that battery cell, as shown in FIG. 1, and using equation (1). As long as all the internal impedances are approximately equal, which is a reasonable assumption, a common impedance multiplier term (IM) can be derived. The common impedance multiplier term (IM) can be derived by manipulating equation (3) into the form of equation (1), yielding:

$$IM = (Z_2 I_1)/(I_1 Z_2 - V_{2,1}). \quad (5)$$

This common impedance multiplier term (IM) is then used in equation (1) for each of the remaining battery cells in the string.

To determine the internal impedance of each battery cell in the remaining strings in the system, the aforedescribed steps are repeated for each string. Thus, measurements are made on two battery cells in each string, as shown in FIG. 2, equations (3) and (4) are solved to determine the internal impedance of each of those two battery cells, equation (5) is used to determine a common impedance multiplier term for that string, measurements are made on each remaining battery cell in that string, as shown in FIG. 1, and equation (1) is used for each battery cell in that string to determine its internal impedance.

According to the foregoing description, the initial measurements in each string are performed on two adjacent battery cells. However, the inventive method is not so limited, and the initial measurements can be made on any two battery cells within a string.

Accordingly, there has been disclosed an improved method for determining the internal impedance of each individual battery cell within a string of serially connected battery cells without disconnecting the battery cells from the string. While a preferred embodiment of the present invention has been disclosed herein, it will be appreciated by those of skill in the art that various adaptations and modifications to the disclosed embodiment are possible, and it is therefore intended that this invention be limited only by the scope of the appended claims.

What is claimed is:

1. In a system having a plurality of rechargeable battery cells arranged in at least one string having a plurality of serially connected battery cells to form a battery system and including a charger coupled across said at least one string, a method for determining the internal impedance of each of said plurality of serially connected battery cells in said at least one string while the battery cells remain connected in the battery system, the method comprising the steps of:

a) drawing a first predetermined current $I_1$ across a first battery cell in said at least one string;

b) measuring the voltage $V_{1,1}$ across said first battery cell during the drawing of said first predetermined current;

c) measuring the voltage $V_{2,1}$ across a second battery cell in said at least one string during the drawing of said first predetermined current;

d) drawing a second predetermined current $I_2$ across said second battery cell;

e) measuring the voltage $V_{1,2}$ across said first battery cell during the drawing of said second predetermined current;

f) measuring the voltage $V_{2,2}$ across said second battery cell during the drawing of said second predetermined current;

g) solving the two simultaneous equations $$I_1 = V_{1,1}/Z_1 + V_{2,1}/Z_2$$

$$I_2 = V_{1,2}/Z_1 + V_{2,2}/Z_2$$

for $Z_1$ and $Z_2$, where $Z_1$ is the internal impedance of said first battery cell and $Z_2$ is the internal impedance of said second battery cell;

h) calculating an impedance multiplier term IM from the equation $$IM = (Z_2 I_1)/(I_1 Z_2 - V_{2,1});$$

and i) for each of the remaining battery cells in said at least one string i1) drawing a predetermined current I across said each battery cell;

i2) measuring the voltage V across said each battery cell during the drawing of said predetermined current; and i3) calculating the internal impedance Z of said each battery cell from the equation $Z = (V/I)IM$.

2. The method according to claim 1 wherein said at least one string comprises at least two strings and the steps a)–i) are performed for each of the at least two strings in the battery system.

3. The method according to claim 1 wherein said first and second battery cells are adjacent to each other.

* * * * *